United States Patent
Xiang et al.

(10) Patent No.: US 6,586,808 B1
(45) Date of Patent: Jul. 1, 2003

(54) SEMICONDUCTOR DEVICE HAVING MULTI-WORK FUNCTION GATE ELECTRODE AND MULTI-SEGMENT GATE DIELECTRIC

(75) Inventors: Qi Xiang, San Jose, CA (US); Witold P. Maszara, Morgan Hill, CA (US); HaiHong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/163,696

(22) Filed: Jun. 6, 2002

(51) Int. Cl.[7] ............................................. H01L 31/119
(52) U.S. Cl. ...................... 257/407; 257/389; 257/381; 257/333; 257/412; 257/344
(58) Field of Search .................. 257/389, 407, 257/381, 333, 412, 344; 438/287, 591, 595, 183, 184, 596

(56) References Cited

U.S. PATENT DOCUMENTS

| | | |
|---|---|---|
| 4,745,079 A | 5/1988 | Pfiester |
| 4,755,478 A | 7/1988 | Abernathey et al. |
| 5,061,647 A | 10/1991 | Roth et al. |
| 5,210,435 A | 5/1993 | Roth et al. |
| 5,593,909 A | 1/1997 | Han et al. |
| 5,717,237 A | 2/1998 | Chi |
| 5,756,365 A | 5/1998 | Kakumu |
| 5,770,490 A | 6/1998 | Frenette et al. |
| 5,894,157 A | 4/1999 | Han et al. |
| 5,960,270 A | 9/1999 | Misra et al. |
| 5,977,591 A | 11/1999 | Fratin et al. |
| 6,013,553 A | 1/2000 | Wallace et al. |
| 6,020,024 A | 2/2000 | Maiti et al. |
| 6,028,339 A | 2/2000 | Frenette et al. |
| 6,051,487 A | 4/2000 | Gardner et al. |
| 6,087,208 A * | 7/2000 | Krivokapic et al. ........ 438/183 |
| 6,097,070 A | 8/2000 | Mandelman et al. |
| 6,107,667 A * | 8/2000 | An et al. |
| 6,204,137 B1 | 3/2001 | Teo et al. |
| 6,207,485 B1 | 3/2001 | Gardner et al. |
| 6,210,999 B1 | 4/2001 | Gardner et al. |
| 6,211,555 B1 | 4/2001 | Randazzo et al. |
| 6,225,669 B1 | 5/2001 | Long et al. |
| 6,274,467 B1 | 8/2001 | Gambino et al. |
| 6,281,559 B1 | 8/2001 | Yu et al. |
| 6,297,106 B1 * | 10/2001 | Pan et al. .................... 438/287 |
| 6,300,177 B1 | 10/2001 | Sundaresan et al. |
| 6,429,068 B1 | 8/2002 | Divakaruni et al. |

FOREIGN PATENT DOCUMENTS

| | | |
|---|---|---|
| EP | 1033752 | 6/2000 |
| JP | 411317459 | 11/1999 |
| WO | 9703462 | 1/1997 |

* cited by examiner

*Primary Examiner*—Tom Thomas
*Assistant Examiner*—Thomas Magee
(74) *Attorney, Agent, or Firm*—Renner, Otto, Boisselle & Sklar, LLP (57) ABSTRACT

A MOSFET and methods of fabrication. The MOSFET includes a gate having a center gate electrode portion being spaced from the layer of semiconductor material by a center gate dielectric. The gate also includes a lateral gate electrode portion adjacent each sidewall of the center gate electrode portion. The lateral gate electrode portions are each spaced from the layer of semiconductor material by a lateral gate dielectric portion.

9 Claims, 5 Drawing Sheets

SEMICONDUCTOR DEVICE HAVING MULTI-WORK FUNCTION GATE ELECTRODE AND MULTI-SEGMENT GATE DIELECTRIC

TECHNICAL FIELD

The present invention relates generally to semiconductor devices and the fabrication thereof and, more particularly, to a semiconductor device having a dual work function gate.

BACKGROUND

A pervasive trend in modern integrated circuit manufacture is to produce semiconductor devices, such as metal oxide semiconductor field effect transistors (MOSFETs), that are as small as possible. In a typical MOSFET, a source and a drain are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

Although the fabrication of smaller transistors allows more transistors to be placed on a single monolithic substrate for the formation of relatively large circuit systems in a relatively small die area, this downscaling can result in a number of performance degrading effects. In FET devices with a channel having a relatively short length, the FET can experience a number of undesirable electrical characteristics referred to as short channel effects (SCE). SCE generally occur when the gate does not have adequate control over the channel region, and can include threshold voltage ($V_t$) roll-off, off current (Ioff) roll-up and drain induced barrier lowering (DIBL). As the physical dimensions decrease, SCE can become more severe. SCE is the result of intrinsic properties of the crystalline materials used in the FET devices. Namely, the band gap and built-in potential at the source/body and drain/body junctions are non-scalable with the reduction of physical device dimensions, such as a reduction in channel length.

A typical technique used to minimize SCE is to fabricate FETs with extensions as part of the source/drain areas. The extensions are commonly formed using a lightly doped drain (LDD) technique as is well known in the art.

However, there still exists a need in the art for semiconductor devices, such as MOSFETs, that have reduced SCE and for fabrication techniques to make those semiconductor devices.

SUMMARY OF THE INVENTION

According to one aspect of the invention, a MOSFET is provided. The MOSFET includes a source and a drain formed in a layer of semiconductor material and a gate disposed above the layer of semiconductor material to define a channel interposed between the source and the drain. The gate includes a center gate electrode portion having a first work function and being spaced from the layer of semiconductor material by a center gate dielectric, the center gate dielectric establishing a first capacitance from the center gate electrode portion to the layer of semiconductor material; and a lateral gate electrode portion adjacent each sidewall of the center gate electrode portion and each lateral gate electrode portion having a second work function different from the first work function, and each lateral gate electrode portion being spaced from the layer of semiconductor material by a lateral gate dielectric portion, each lateral gate dielectric portion establishing a second capacitance from the lateral gate electrode portions to the layer of semiconductor material, the second capacitance different from the first capacitance, and the first work function, the second work function, the first capacitance and the second capacitance cooperate so that an absolute value of a device threshold in a center region of the channel is lower than an absolute value of a device threshold in regions of the channel adjacent each of the source and the drain.

According to another aspect of the invention, a method of fabricating a MOSFET having a dual work function gate is disclosed. The method includes providing a layer of semiconductor material; forming a pair of spaced apart lateral gate dielectric portions on the layer of semiconductor material; forming a center gate dielectric portion on the layer of semiconductor material between the lateral gate dielectric portions; forming a center gate electrode portion on the center gate dielectric portion, the center gate electrode portion having a first work function; and forming a lateral gate electrode portion adjacent each sidewall of the center gate electrode portions and on respective lateral gate dielectric portions, the lateral gate electrode portion having a second work function different from the first work function.

BRIEF DESCRIPTION OF DRAWINGS

These and further features of the present invention will be apparent with reference to the following description and drawings, wherein.

DISCLOSURE OF INVENTION

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

The present invention relates to semiconductor devices, such as metal oxide semiconductor field effect transistors (MOSFET), having a dual work function gate. According to one embodiment of the invention, a gate is formed having a center region made from a first material that has a first work function and lateral gate portions (also referred to herein as side gate portions) made from a second material having a second work function. The center gate electrode is separated from a body region by a center gate dielectric portion made from a first high-K material and having a first thickness. The lateral gate electrode portions are separated from the body region by lateral gate dielectric portions made from a second high-K material having a second thickness. The first high-K material and the second high-K material can have different K-values as discussed below in greater detail. In general, properties of the gate dielectric of a MOSFET control the capacitive coupling of the electric field from the gate electrode to the channel. Therefore, the thickness and K-value of the dielectric materials determine the capacitance from the gate electrode to the body and, as a result, these features can be selected to affect device performance (including, for example, device threshold).

In addition, the work functions of the materials for the center gate portion and the lateral gate portions contribute to controlling device threshold along a channel of the semiconductor device. In particular, the material used for the center gate portion (in combination with the properties of the center gate dielectric portion) contributes to setting the threshold voltage ($V_t$) in a middle region of the channel and the lateral gate portions (in combination with the properties of the lateral gate dielectric portions) contribute to setting the $V_t$ of the channel near a source and a drain.

The material used for the lateral gate portions is selected such that the device threshold (expressed as a absolute value) near the source and the drain is higher than the device threshold (expressed as an absolute value) in a middle region of the channel. To achieve this result in an NMOS device, the center gate portion should be selected to have a lower work function than the work function of the lateral gate portions. To achieve this result in a PMOS device, the center gate portion should be selected to have a higher work function than the work function of the lateral gate portions. Without being bound by theory, it is believed that the dual work function gate described herein offers improved control over the channel so as to reduce device performance degradation caused by short channel effects (SCE). More particularly, the properties of the gate electrode portions and the gate dielectric portions can be tuned along the channel to optimize the performance of the MOSFET.

Figure 1:
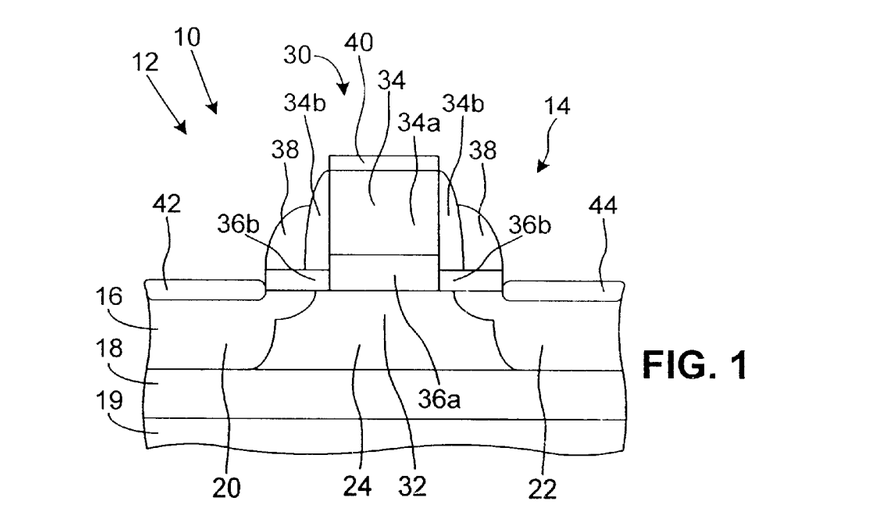
FIG. 1 is a schematic block diagram of a semiconductor device formed in accordance with a first example embodiment of the present invention.

With reference to FIG. 1, a semiconductor device 10 according to a first example embodiment of the present invention is illustrated. The illustrated semiconductor device 10 is a MOSFET used, for example, in the construction of a complimentary metal oxide semiconductor (CMOS) integrated circuit. As one skilled in the art will appreciate, the gate structures and the techniques for fabricating the gate structures described herein can be used for other types of semiconductors (e.g., other types of transistors, memory cells, etc.) and the illustrated MOSFETs are merely exemplary. However, the semiconductor device 10 will sometimes be referred to herein as a MOSFET 12.

The MOSFET 12 has an active region 14 formed in a layer of semiconductor material 16. The layer of semiconductor material 16 can be, for example, a silicon substrate for the formation of bulk-type devices. Alternatively, and as illustrated, the layer of semiconductor material 16 can be, for example, a silicon film formed on a layer of insulating material 18 (often referred to as a buried oxide (BOX) layer). The insulating layer 18 is, in turn, formed on a semiconductor substrate 19 so that the resultant devices are formed in a semiconductor-on-insulator (SOI) format, as is well known in the art.

The active region 14 includes a source 20, a drain 22 and a body 24 disposed between the source 20 and the drain 22. The source 20 and the drain 22 each can respectively include deep doped regions and extensions as are known in the art.

A gate 30 is disposed on the layer of semiconductor material 16 over the body 22 and defines a channel 32 within the body 22 (the channel 32 being interposed between the source 20 and the drain 22). The gate 30 includes a gate electrode 34 spaced apart from the layer of semiconductor material 16 by a gate dielectric 36. In one embodiment of the MOSFET 12, the channel 32 has a length of about 10 nm to about 75 nm.

The gate electrode 34 is comprised of a center gate electrode portion 34a and two lateral gate electrode portions 34b, the lateral gate electrode portions 34b being disposed adjacent respective sidewalls of the center gate electrode portion 34a. The material of the center gate electrode portion 34a is selected to be different from the material used for the lateral gate electrode portions 34b. For an NMOS device, the materials are selected such that the center gate electrode portion 34a has a lower work function than the material of the lateral gate electrode portions 34b. For a PMOS device, the materials are selected such that the center gate electrode portion 34a has a higher work function than the material of the lateral gate electrode portions 34b.

As illustrated, the lateral gate electrode portions 34b are disposed over portions of the channel 32 adjacent the source 20 and the drain 22. Due to the differences in work function between the gate electrode portions 34a and 34b, the absolute value of the device threshold near the source 20 and the drain 22 (as controlled in part by the lateral gate electrode portions 34b) will be higher than the absolute value of the device threshold for a center portion of the channel 32 (as controlled in part by the center gate electrode portion 34a). Absolute values of the device threshold are used to take into account differences in actual voltage applied to NMOS devices versus PMOS devices. The differential in device threshold between the foregoing portions of the channel will typically be up to a few tenths of a volt.

As one skilled in the art will appreciate, the differing materials used for the center gate electrode portion 34a and the lateral gate electrode portions 34b leads to a work function differential between the center gate electrode portion 34a and the lateral gate electrode portions 34b. Any suitable material can be selected for the center gate electrode portion 34a and any corresponding suitable material can be selected for the lateral gate electrode portions 34b. The materials that can be used for the center gate electrode portion 34a include, for example, polycrystalline silicon, polycrystalline silicon-germanium, a metal (e.g., tungsten, tantalum, aluminum, nickel, ruthenium, rhodium, palladium, platinum, etc.) and/or a metal-containing compound (e.g., tantalum nitride, titanium nitride, etc.). The materials that can be used for the lateral gate electrode portion 34b include, for example, polycrystalline silicon, polycrystalline silicon-germanium, a metal (e.g., tungsten, tantalum, aluminum, nickel, ruthenium, rhodium, palladium, platinum, etc.) and/ or a metal-containing compound (e.g., tantalum nitride, titanium nitride, etc.).

The center gate electrode portion 34a is disposed on a center gate dielectric portion 36a (the center gate dielectric portion 36a physically separating and capacitively coupling the center gate electrode portion 34a and the layer of semiconductor material 16). Similarly, the lateral gate electrode portions 34b are disposed on lateral gate dielectric portions 36b (the lateral gate dielectric portions 36b physically separating and capacitively coupling the lateral gate electrode portions 34b and the layer of semiconductor material 16).

In one embodiment of the present invention, each of the center gate dielectric portion 36a and the lateral gate dielectric portions 36b are made from a high-K material. High-K materials are discussed in greater detail below. However, for purposes herein, the term "high-K material" or "high-K dielectric material" refers to a material, or stack of materials, having a relative permittivity, or K, in one embodiment of about ten (10) or more, and in another embodiment of about twenty (20) or more. Relative permittivity is the ratio of the absolute permittivity ($\epsilon$) found by measuring capacitance of the material to the permittivity of free space ($\epsilon_o$), that is K=$\epsilon/\epsilon_o$. As used herein, a "standard-K dielectric material" refers to a dielectric material having a relative permittivity, or K, of up to about ten. Example standard-K dielectric materials include, for example, silicon dioxide (K of about 3.9), silicon oxynitride (K of about 4 to 8 depending on the relative content of oxygen and nitrogen) and silicon nitride (K of about 6 to 9).

Use of a high-K material for the gate dielectric portions 36a and 36b is advantageous since the use of high-K dielectrics generally result in low leakage devices and improves device reliability. Leakage and reliability degradation can occur when the thickness of a standard-K dielectric material becomes too thin (e.g., approaching about 10 Å depending on the material used). A high-K dielectric allows for the establishment of a suitable capacitance with a physically thicker dielectric layer. For example, a nitride gate dielectric having a K of about 7.8 and a thickness of about 100 Å is substantially electrically equivalent to an oxide gate dielectric having a K of about 3.9 and a thickness of about 50Å.

In one embodiment of the present invention, the center gate dielectric portion 36a is made from a different high-K material (or stack of materials) than the high-K material (or stack of materials) used for the lateral gate dielectric portions 36b. Accordingly, the physical thickness of the center gate dielectric portion 36a and the lateral gate dielectric portions 36b may differ. For example, in the illustrated embodiments, the center gate dielectric portion 36a is thicker than the lateral gate dielectric portions 36b. However, depending on the materials selected and the desired properties of the gate dielectric portions 36a and 36b, the center gate dielectric portion 36a can have the same thickness as the lateral gate dielectric portions 36b or can be thinner than the lateral gate dielectric portions 36b.

Although other materials can be selected for the gate dielectric portions 36a and 36b, hafnium oxide (e.g., $HfO_2$), zirconium oxide (e.g., $ZrO_2$), cesium oxide (e.g., $CeO_2$), aluminum oxide (e.g., $Al_2O_3$), titanium oxide (e.g., $TiO_2$) and yttrium oxide (e.g., $Y_2O_3$) are example suitable materials for the gate dielectric portions 36a and 36b. In addition, all binary and ternary metal oxides and ferroelectric materials having a K higher than, in one embodiment, about twenty (20) can be used for the gate dielectric portions 36a and 36b.

In addition, when high-K materials are selected for the gate dielectric portions 36a and 36b, a buffer interface (not shown) can be used between the layer of semiconductor material 16 and the gate dielectric portions 36a and 36b. The buffer interface can be, for example, an oxide layer having a thickness of about 0.5 nm to about 0.7 nm. The buffer interface layer can be formed by a low temperature (about 500° C.) thermal oxidation process, a remote plasma deposition process, an ALD process or the like. The buffer interface assists in reducing integration issues that may arise when attempting form a layer of high-K material on a semiconductor layer. Therefore, if the gate dielectric is formed from a standard-K material or if the buffer interface is not desired, the buffer interface can be omitted.

In one alternative embodiment of the present invention, one or both of the center gate dielectric portion 36a and the lateral gate dielectric portions 36b can be made from standard-K materials. In yet another alternative embodiment of the present invention, and as discussed in greater detail below with respect to FIG. 7, the lateral gate dielectric portions 36b can be formed from one layer of dielectric material and the center gate dielectric portion 36a can be formed from the layer used for the lateral gate dielectric portions 36b with an additional layer of dielectric material formed thereon. Also, as discussed in greater detail below with respect to FIG. 8, the center gate dielectric portion 36a and the lateral gate dielectric portions 36b can be made from the same material.

The MOSFET 12 can be provided with sidewall spacers 38, as is known in the art. Also, the MOSFET 12 can be provided with a gate electrode contact 40 used in establishing electrical connection to the gate electrode 34, including the center gate electrode portion 34a and the lateral gate electrode portions 34b (mainly via sidewall junctions of the center gate electrode portion 34a and the lateral gate electrode portions 34b). In addition, the MOSFET 12 can be provided with a source contact 42 and a drain contact 44. The source contact 42 and the drain contact 44 can be silicide regions as is known in the art. If appropriate, the gate electrode contact 40 can also be a silicide region or can be formed from a metal layer or other appropriate material.

Figure 9:
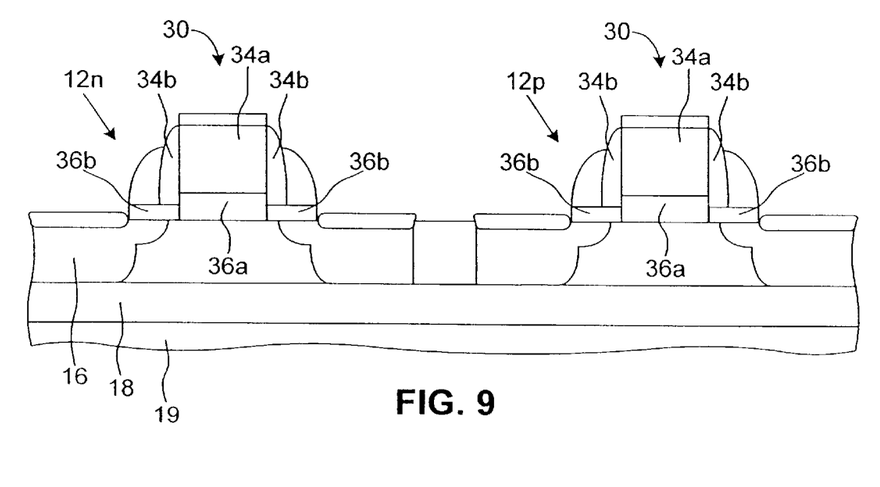
FIG. 9 is a schematic block diagram of an integrated circuit formed in accordance with one aspect of the invention.

FIG. 9 illustrates an example of an integrated circuit have an NMOS device 12n and a PMOS device 12p. The NMOS device 12n and the PMOS device 12p are each fabricated with a dual work function gate 30 as described herein. Although illustrated as the gate 30 made in accordance with the method 50 (FIG. 2) described below, the gate 30 can alternatively be made in accordance with the method 100 (FIG. 5) described below or any other suitable method of fabrication. It is also noted that for any embodiment of the present invention described herein, the gate 30 can take on various physical configurations that differ from those illustrated in shape, size, geometry, scale, physical configuration and the like.

In the NMOS device 12n and the PMOS device 12p, polysilicon is selected for the center gate electrode portion 34a. For the NMOS device, the polysilicon center gate electrode is doped with N+ type ions to have a work function of about 4.15 eV. For the PMOS device, the polysilicon center gate electrode is doped with P+ type ions to have a work function of about 5.1 eV. In this embodiment, the NMOS device 12n and the PMOS device 12p have center gate electrode portions 34a made from the same base material. A mid-gap material (e.g., a metal or metal-containing compound having a work function near the center of the band-gap (about 4.6 eV)) is elected for use in both NMOS devices and PMOS devices as the lateral gate electrode portions 34b. Selecting the same materials for the gates 30 of both the NMOS device 12n and the PMOS device 12p can simplify fabrication of the devices and reduce material integration issues. However, in an alternative embodiment, a first pair of materials can be selected for the NMOS device 12n and a second pair of materials can be selected for the PMOS device 12p to provide desired characteristics respectively to the NMOS device 12n and the PMOS device 12p. Similarly, the center gate dielectric portions 36a of the NMOS device 12n and the PMOS device 12p can be made from the same material and/or the lateral gate dielectric portions 36b of the NMOS device 12n and the PMOS device 12p can be made from the same material. Alternatively, a first pair of materials can be selected for the gate dielectric 36 of the NMOS device 12n and a second pair of materials can be selected for the gate dielectric 36 of the PMOS device 12p to assist in providing desired characteristics respectively to the NMOS device 12n and the PMOS device 12p.

Figure 2:
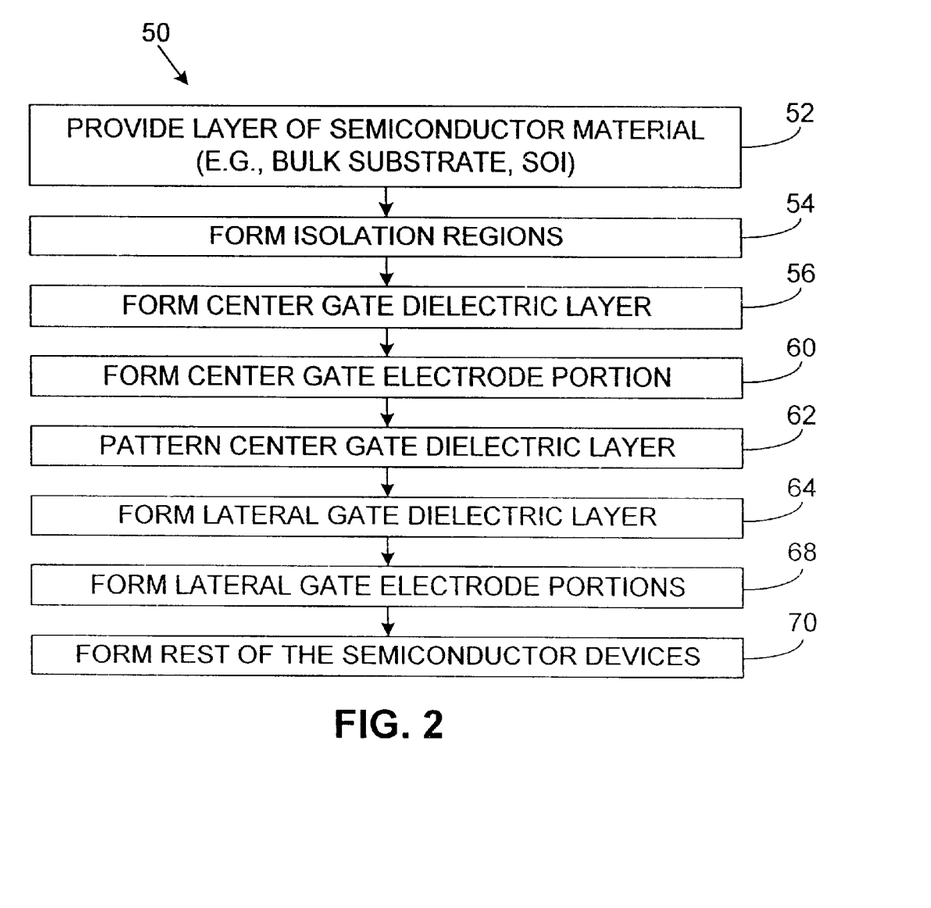
FIG. 2 is a flow chart illustrating a method of forming the semiconductor device of FIG. 1.

Referring now to FIG. 2, a method 50 of forming the MOSFET 12 is illustrated. With additional reference to FIG. 3A, the method 50 starts in step 52 where the layer of semiconductor material 16 is provided. As indicated above, the layer of semiconductor material 16 can be a semiconductor substrate (such as a silicon substrate) for the formation of bulk-type devices. Alternatively, and as illustrated, the layer of semiconductor material 16 can be a semiconductor film (such as a silicon film or a silicon-germanium film) formed as part of a SOI substrate stack. If desired, isolation regions (for example, shallow trench isolation (STI) regions) can be formed in the layer of semiconductor material 16 to define the size and placement of multiple active regions 14 within the layer of semiconductor material 16. The isolation regions are formed in step 54 of the method 50, but for simplicity of the drawing figures attached hereto, the isolation regions are not shown.

Figure 3A:
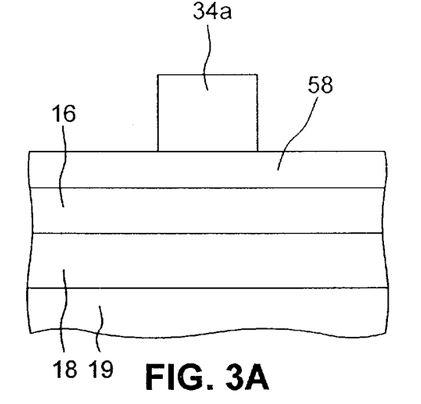
FIGS. 3A through 3E illustrate the semiconductor device of FIG. 1 in various stages of manufacture.

Next, in step 56, a layer of high-K material 58 used to form the center gate dielectric portion 36a is formed on the layer of semiconductor material 16. The layer of material 58 can be formed by growing or depositing an appropriately selected high-K material on top of the layer or semiconductor material 16 to a desired thickness. In an alternative embodiment, the layer of high-K material 58 can be a stack of two or more layers of different materials used to form a high-K dielectric stack. In another example embodiment, the layer of high-K material 58 can be substituted with a layer of standard-K material. As indicated, a buffer interface layer can be formed before formation of the layer of high-K material 58.

Exemplary high-K materials are identified below in Table 1. It is noted that Table 1 is not an exhaustive list of high-K materials and other high-K materials may be available.

TABLE 1

| Dielectric Material | Approximate Relative Permittivity (K) |
|---|---|
| aluminum oxide ($Al_2O_3$) | 9–10 |
| zirconium silicate | 12 |
| hafnium silicate | 15 |
| hafnium silicon oxynitride | 16 |
| hafnium silicon nitride | 18 |
| lanthanum oxide ($La_2O_3$) | 20–30 |
| hafnium oxide ($HfO_2$) | 40 |
| zirconium oxide ($ZrO_2$) | 25 |
| cesium oxide ($CeO_2$) | 26 |
| bismuth silicon oxide ($Bi_4Si_2O_{12}$) | 35–75 |

TABLE 1-continued

| Dielectric Material | Approximate Relative Permittivity (K) |
|---|---|
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| BST ($Ba_{1-x}Sr_xTiO_3$) | ~20–200 |
| barium strontium oxide ($Ba_{1-x}Sr_xO_3$) | ~20–200 |
| $PbTiO_3$ | ~20–200 |
| barium titanate ($BaTiO_3$) | ~20–200 |
| $SiTiO_3$ | ~20–200 |
| $PbZrO_3$ | ~20–200 |
| PST ($PbSc_xTa_{1-x}O_3$) | 3000 |
| PZN ($PbZn_xNb_{1-x}O_3$) | ~500–5000 |
| PZT ($PbZr_xTi_{1-x}O_3$) | ~150–1000 |
| PMN ($PbMg_xNb_{1-x}O_3$) | ~500–5000 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$, but may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula $Ta_2O_5$ is used, $Ta_xO_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

With continued reference to FIGS. 2 and 3A, the method 50 continues in step 60 where the center gate electrode portion 34a is formed. More specifically, a layer of material used to form the center gate electrode portion 34a is grown or deposited on the layer of high-K material 58. As indicated above, the material for the center gate electrode portion 34a is selected (and, if appropriate, doped) to have a particular work function. After forming the layer of material used for the center gate electrode portion 34a, that layer of material is patterned to form the center gate electrode portion 34a in the desired size, shape and location by a technique suitable for the material, such as by wet-chemical etching or dry etching. In one embodiment of the MOSFET 12, the center gate electrode portion 34a has a width that is about 50% to about 90% of the total gate length.

Figure 3B:
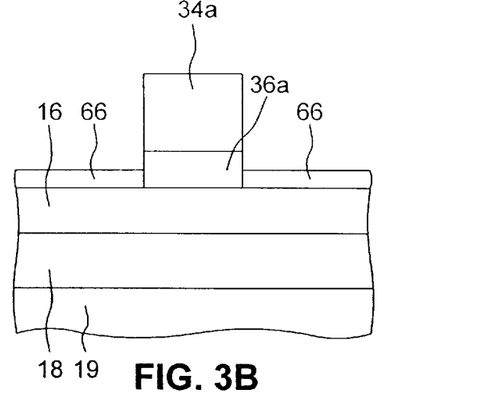

With additional reference to FIG. 3B, the method 50 continues in step 62 where the layer of high-K material 58 is patterned to be coextensive with the center gate electrode portion 34a, thereby forming the center gate dielectric portion 36a.

Thereafter, in step 64, another layer of high-K material 66 used to form the lateral gate dielectric portions 36b is formed on the layer of semiconductor material 16. The layer of material 66 can be formed by growing or depositing an appropriately selected high-K material on top of the layer or semiconductor material 16 to a desired thickness (any high-K material formed on the center gate electrode portion 34a can be removed immediately following formation or in subsequent processing steps). In an alternative embodiment, the layer of high-K material 66 can be a stack of two or more layers of different materials used to form a high-K dielectric stack. In another example embodiment, the layer of high-K material 66 can be substituted with a layer of standard-K material.

Figure 3C:
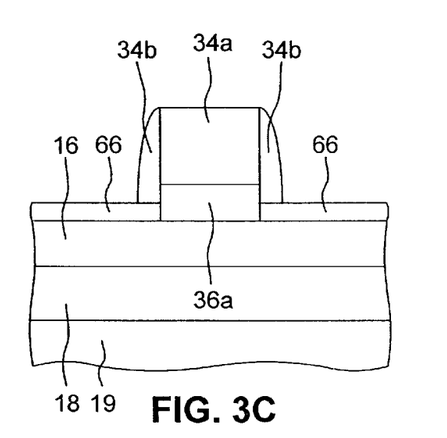

Next, in step 68 and as illustrated in FIG. 3C, a lateral gate electrode portion 34b is formed adjacent each side of the center gate electrode portion 34a. As indicated above, the material selected for the lateral gate electrode portions 34b has a different work function than the material selected for the center gate electrode portion 34a such that the absolute value of the threshold voltage ($V_t$) in the middle of the channel (as controlled by the center gate electrode portion 34a) is less than the absolute value of the threshold voltage found adjacent the source/body junction and the drain/body junction (as controlled by the lateral gate electrode portions 34b).

The lateral gate electrode portions 34b are formed to have a desired width. In one embodiment of the present invention, the lateral gate electrode portions 34b account for about 10% to about 50% of the total gate length. The lateral gate electrode portions 34b can be formed using techniques similar to those used for sidewall spacer formation. For instance, the lateral gate electrode portions 34b can be formed by depositing the desired material and anisotropically etching back the deposited material to the layer of dielectric material 58. In an alternative embodiment, the material used to form the lateral gate electrode portions 34b can be deposited and patterned using other techniques, such as, for example, wet-chemical etching or dry etching with the assistance of a mask layer patterned using photolithography.

Figure 3D:
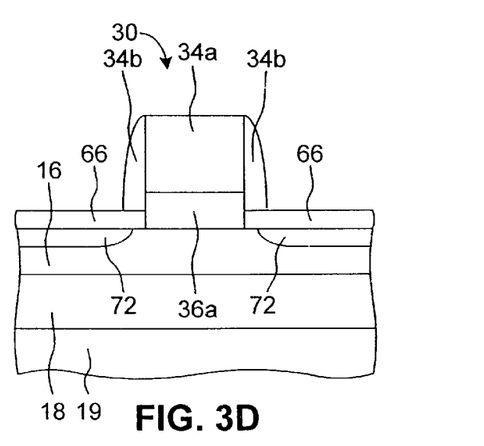

With reference to FIGS. 2 and 3D, the method 50 continues in step 70 where the rest of the components of the semiconductor device 10 are formed. Step 70 can include implantation of extensions 72. Formation of shallow source 20 and drain 22 extensions 72, such as by using a lightly doped drain (LDD) technique, is well known in the art and will not be described in detail herein. Briefly, for a P-type extension region 72, ions such as boron, gallium or indium can be implanted. For an N-type extension region 72, ions such as antimony, phosphorous or arsenic can be implanted. The ions used to form the extensions 72 may diffuse slightly under the gate 34 as is conventional.

Figure 3E:
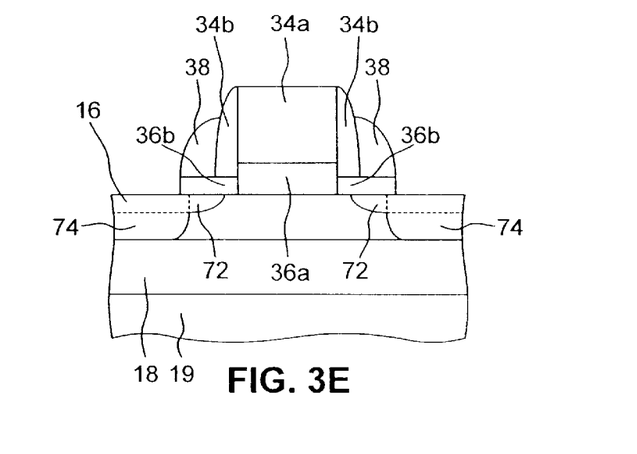

With additional reference to FIG. 3E, step 70 can include sidewall spacers 38 formation. The spacers 38 are formed from a material such as a nitride (e.g., silicon nitride, or $Si_3N$). The formation of the spacers 38 is well known in the art and will not be described in greater detail.

The spacers 38 and the gate 30 act as a self-aligned mask for implantation of the deep doped regions 74. Implanting dopant species to form the deep doped regions 74 of the source 20 and the drain 22, respectively, is well known in the art and will not be described in great detail herein. Briefly, to form a P-type deep doped region 74, ions such as boron, gallium or indium can be implanted. N-type deep doped regions 74 can be formed by implanting ions such as antimony, phosphorous or arsenic. Following implantation of the deep doped regions 74 (and optionally after extension implantation) an anneal cycle is carried out to activate the dopant species.

Thereafter, any additional processing for fabricating the MOSFET 12 can be carried out. Such additional processing can include for example, the formation of silicide regions for the source contact 42 and the drain contact 44, the formation of the gate electrode contact 40, the formation of an oxide cap (not shown), and the like. Prior to source contact 42 and drain contact 44 formation, any excess portions of the layer of high-K material 66 extending beyond the gate 34 and the sidewall spacers 38 can be removed, resulting in the gate dielectric portions 36b.

Figures 4, 5:
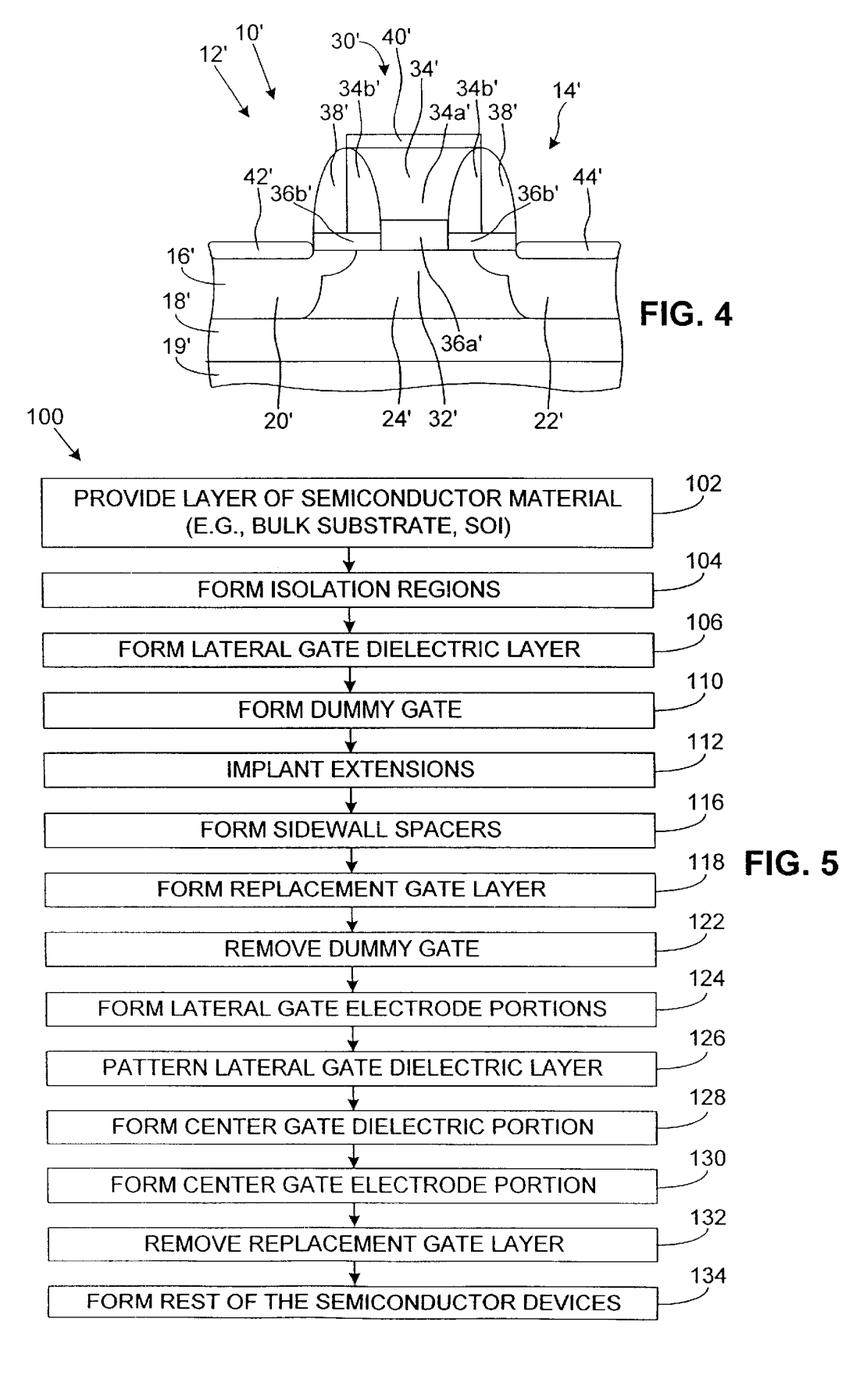
FIG. 4 is a schematic block diagram of a semiconductor device formed in accordance with a second example embodiment of the present invention.
FIG. 5 is a flow chart illustrating a method of forming the semiconductor device of FIG. 4.

Referring now to FIG. 4, a semiconductor device 10' according to a second example embodiment of the present invention is illustrated. The illustrated semiconductor device 10' is a MOSFET and will sometimes be referred to herein as a MOSFET 12'. The MOSFET 12' has an active region 14' formed in a layer of semiconductor material 16'. The layer of semiconductor material 16' can be, for example, a silicon substrate for the formation of bulk-type devices. Alternatively, the layer of semiconductor material 16' can be, for example, a silicon film formed on a layer of insulating material 18' (or BOX layer). The insulating layer 18' is, in turn, formed on a semiconductor substrate 19' so that the resultant devices are formed in a semiconductor-on-insulator (SOI) format, as is well known in the art.

The active region 14' includes a source 20', a drain 22' and a body 24' disposed between the source 20' and the drain 22'. The source 20' and the drain 22' each respectively include deep doped regions and extensions as are known in the art.

A gate 30' is disposed on the layer of semiconductor material 16' over the body 22' and defines a channel 32' within the body 22' (the channel 32' being interposed between the source 20' and the drain 22'). The gate 30' includes a gate electrode 34' spaced apart from the layer of semiconductor material 16' by a gate dielectric 36'. In one embodiment of the MOSFET 12', the channel 32' has a length of about 10 nm to about 75 nm.

The gate electrode 34' is comprised of a center gate electrode portion 34a' and two lateral gate electrode portion 34b', the lateral gate electrode portions 34b' being disposed adjacent respective sidewalls of the center gate electrode portion 34a'. The material of the center gate electrode portion 34a' is selected to be different from the material used for the lateral gate electrode portions 34b'. For an NMOS device, the material are selected such that the center gate electrode portion 34a' has a lower work function than the material of the lateral gate electrode portions 34b'. For a PMOS device, the materials are selected such that the center gate electrode portion 34a' has a higher work function than the material of the lateral gate electrode portions 34b'.

As illustrated, the lateral gate electrode portions 34b' are disposed over portions of the channel 32' adjacent the source 20' and the drain 22'. Due to the differences in work function between the gate electrode portions 34a' and 34b', the absolute value of the device threshold near the source 20' and the drain 22' (as controlled in part by the lateral gate electrode portions 34b') will be higher than the absolute value of the device threshold for a center portion of the channel 32' (as controlled in part by the center gate electrode portion 34a'). Absolute values of the device threshold are used to take into account differences in actual voltage applied to NMOS devices versus PMOS devices. The differential in device threshold between the foregoing portions of the channel will typically be up to a few a tenths of a volt.

As one skilled in the art will appreciate; the differing materials used for the center gate electrode portion 34a' and the lateral gate electrode portions 34b' leads to a work function differential between the center gate electrode portion 34a' and the lateral gate electrode portions 34b'. Any suitable material can be selected for the center gate electrode portion 34a' and any corresponding suitable material can be selected for the lateral gate electrode portions 34b'. The materials that can be used for the center gate electrode portion 34a' include, for example, polycrystalline silicon, polycrystalline silicon-germanium, a metal (e.g., tungsten, tantalum, aluminum, nickel, ruthenium, rhodium, palladium, platinum, etc.) and/or a metal-containing compound (e.g., tantalum nitride, titanium nitride, etc.). The materials that can be Used for the lateral gate electrode portions 34b' include, for example, polycrystalline silicon, polycrystalline silicon-germanium, a metal (e.g., tungsten, tantalum, aluminum, nickel, ruthenium, rhodium, palladium, platinum, etc.) and/or a metal-containing compound (e.g., tantalum nitride, titanium nitride, etc.).

The center gate electrode portion 34a' is disposed on a center gate dielectric portion 36a' (the center gate dielectric portion 36a' physically separating and capacitively coupling the center gate electrode portion 34a' and the layer of semiconductor material 16'). Similarly, the lateral gate electrode portions 34b' are disposed on lateral gate dielectric portions 36b' (the lateral gate dielectric portions 36b' physically separating and capacitively coupling the center gate electrode portions 34b' and the layer of semiconductor material 16'). In one embodiment of the present invention, each of the center gate dielectric portion 36a' and the center gate dielectric portions 36b' are made from a high-K material. In addition, and as described in greater detail above, a buffer interface (not shown) can be provided between the gate dielectric portions 36a', 36b' and the layer of semiconductor material 16'.

In one embodiment of the present invention, the center gate dielectric portion 36a' is made from a different high-K material (or stack of materials) than the high-K material (or stack of materials) used for the lateral gate dielectric portions 36b'. Accordingly, the physical thickness of the center gate dielectric portion 36a' and the lateral gate dielectric portions 36b' may differ. For example, in the illustrated embodiments, the center gate dielectric portion 36a' is thicker than the lateral gate dielectric portions 36b'. However, depending on the materials selected and the desired properties of the gate dielectric portions 36a' and 36b', the center gate dielectric portion 36a' can have the same thickness as the lateral gate dielectric portions 36b' or can be thinner than the lateral gate dielectric portions 36b'.

Although other materials can be selected for the gate dielectric portions 36a' and 36b', hafnium oxide (e.g., $HfO_2$), zirconium oxide (e.g., $ZrO_2$), cesium oxide ($CeO_2$), aluminum oxide (e.g., $Al_2O_3$), titanium oxide ($TiO_2$) and yttrium oxide ($Y_2O_3$) are example suitable materials for the gate dielectric portions 36a' and 36b'. In addition, all binary and ternary metal oxides and ferroelectric materials having a K higher than, in one embodiment, about twenty (20) can be used for the gate dielectric portions 36a' and 36b'.

In another alternative embodiment of the present invention, one or both of the center gate dielectric portion 36a' and the lateral gate dielectric portions 36b' can be made from standard-K materials. In yet another alternative embodiment of the present invention, and as discussed in greater detail below with respect to FIG. 7, the lateral gate dielectric portions 36b' can be formed from one layer of dielectric material and the center gate dielectric portion 36a' can be formed from the layer used for the lateral gate dielectric portions 36b' with an additional layer of dielectric material formed thereon. Also, as discussed in greater detail below with respect to FIG. 8, the center gate dielectric portion 36a' and the lateral gate dielectric portions 36b' can be made from the same material.

The MOSFET 12' can be provided with sidewall spacers 38', as is known in the art. Also, the MOSFET 12' can be provided with a gate electrode contact 40' used in establishing electrical connection to the gate electrode 34', including the center gate electrode portion 34a' and the lateral gate electrode portions 34b' (mainly via sidewall junctions of the center gate electrode portion 34a' and the lateral gate electrode portions 34b'). In addition, the MOSFET 12' can be provided with a source contact 42' and a drain contact 44'. The source contact 42' and the drain contact 44' can be suicide regions as is known in the art. If appropriate, the gate electrode contact 40' can also be a silicide region or can be formed from a metal layer or other appropriate material.

Referring now to FIG. 5, a method 100 of forming the MOSFET 12' is illustrated. With additional reference to FIG. 6A, the method 100 starts in step 102 where the layer of semiconductor material 16' is provided. As indicated above, the layer of semiconductor material 16' can be a semiconductor substrate (such as a silicon substrate) for the formation of bulk-type devices or a semiconductor film. Alternatively, and as illustrated, the layer of semiconductor material 16 can be a semiconductor film (such as a silicon film or a silicon-germanium film) formed as part of a SOI substrate stack. If desired, isolation regions (for example, shallow trench isolation (STI) regions) can be formed in the layer of semiconductor material 16' to define the size and placement of multiple active regions 14' within the layer of semiconductor material 16'. The isolation regions are formed in step 104 of the method 100, but for simplicity of the drawing figures attached hereto, the isolation regions are not shown.

Figure 6A:
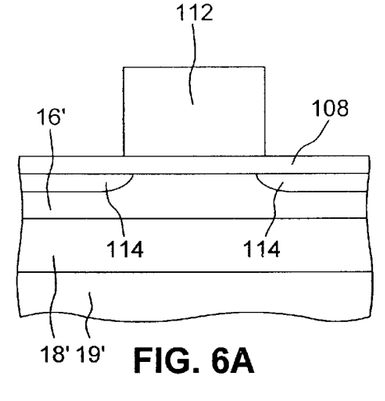
FIGS. 6A through 6E illustrate the semiconductor device of FIG. 4 in various stages of manufacture.

Next, in step 106, a layer of high-K material 108 used to form the lateral gate dielectrics 36b' is formed on the layer of semiconductor material 16'. The layer of high-K material 108 can be formed by growing or depositing an appropriately selected high-K material on top of the layer or semiconductor material 16' to a desired thickness. In an alternative embodiment, the layer of high-K material 108 can be a stack of two or more layers of different materials used to form a high-K dielectric stack. In another example embodiment, the layer of high-K material 108 can be substituted with a layer of standard-K material.

Next, in step 110 a dummy gate 112 is formed. More specifically, a layer of material used to form the dummy gate 112 is grown or deposited on the layer of high-K material 108. The layer of material used to form the dummy gate 112 is then patterned using conventional techniques to have a placement and size corresponding to the desired placement and size of the gate 34'.

Thereafter, in step 112, extensions regions 114 for the source 20' and the rain 22' are implanted. The extensions 114 can be formed using the techniques described above for the formation of extensions 72 of the first embodiment of the semiconductor device 10 and will not be described in greater detail.

Figure 6B:
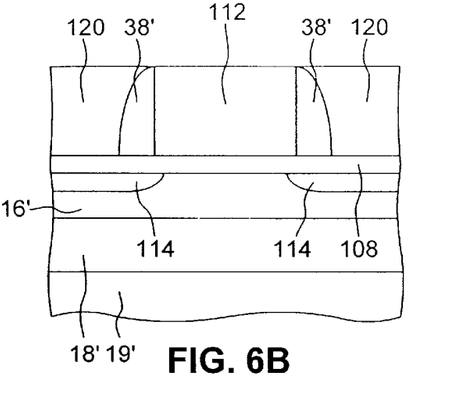

With additional reference to FIG. 6B, the method 100 continues in step 116 where the sidewall spacers 38' are formed adjacent the dummy gate 112. The spacers 38' are formed using conventional techniques and can be made from a material such as a nitride (e.g., silicon nitride, or $Si_3N$).

Thereafter, in step 118, a layer used to assist in replacing the dummy gate 112 with the gate electrode 34' is formed. More specifically, a replacement gate layer 120 is grown or deposited to fill the spaces between adjacent spacers 38'/ dummy gate 112 structures. The replacement gate layer 120 is then planarized (e.g., by chemical mechanical planarization (CMP)) to have a top surface generally even with the top surface of the dummy gate 112. The replacement gate layer 120 can be made from any suitable material, such as, for example, an oxide.

Figure 6C:
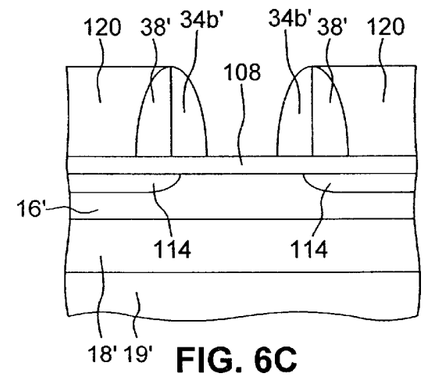

Next, in step 122 and as illustrated in FIG. 6C, the dummy gate 112 is removed using an appropriate technique, such as, for example, wet-chemical etching or dry etching. Next, in step 124, the lateral gate electrode portions 34b' are formed adjacent the spacers 38'. More specifically, the lateral gate electrode portions 34b' are formed adjacent surfaces of the sidewall spacers 38' that were disposed against the dummy gate 112 before the dummy gate 112 was removed. Suitable materials for the lateral gate electrode portions 34b' include those materials discussed for the lateral gate electrode portions 34b of the first embodiment of the MOSFET 12 (FIG. 1).

The lateral gate electrode portions 34b' are formed to have a desired width. In one embodiment of the present invention, the lateral gate electrode portions 34b' account for about 10% to about 50% of the total gate length. The lateral gate electrode portions 34b' can be formed using techniques similar to those used for sidewall spacer formation. For instance, the lateral gate electrode portions 34b' can be formed by growing or depositing the desired material to overfill the void between the spacers 38'. The material is then planarized and anisotropically etched back to the layer of high-K material 108. In an alternative embodiment, the material used to form the lateral gate electrode portions 34b' can be deposited and patterned using other techniques, such as, for example, wet-chemical etching or dry etching with the assistance of a masked layer patterned using photolithography.

Figure 6D:
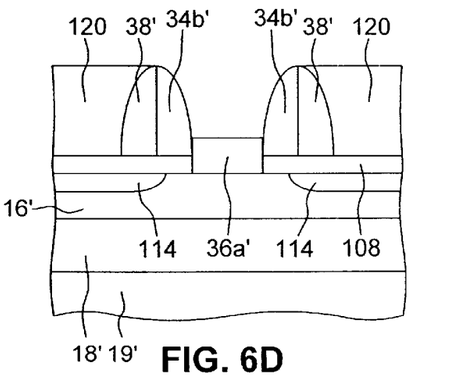

Next, in step 126 and as illustrated in FIG. 6D, a portion of the layer of high-K material 108 is removed between the lateral gate electrode portions 34b'. Next in step 128, the center gate dielectric portion 36a' is formed by depositing or growing a second layer of high-K material. The second layer of high-K material can be deposited to overfill the void between the lateral gate electrode portions 34b', then planarized to the upper surface of the replacement gate layer 120 and then etched to the appropriate thickness (using, for example, a timed ion-reactive etch technique). Alternatively, before step 106, a first high-K material layer for forming the center gate dielectric portion 36a' is formed, then masked and patterned. In this alternative embodiment, a second high-K material layer is formed, which is then optionally polished back and/or etched to form the lateral gate dielectric portions 36b'. In yet another example embodiment, after step 106, the layer of dielectric material 108 is masked and etched form a void for the center gate dielectric portion 36a'. In this alternative embodiment, a second dielectric material layer is deposited and then polished back. Thereafter, the mask is removed.

Figure 6E:
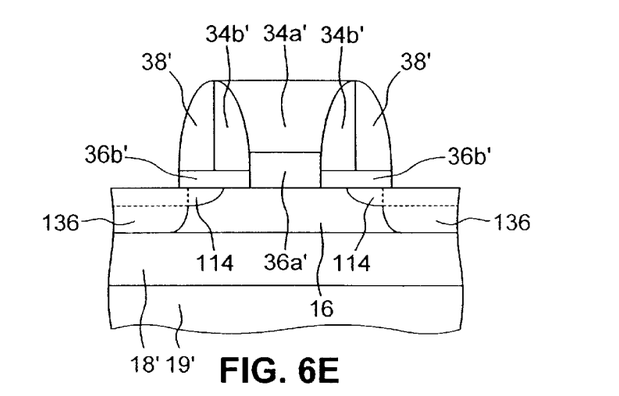

Next, in step 130 and with additional reference to FIG. 6E, the center gate electrode portion 34a' is formed. More specifically, a layer of material used to form the center gate electrode portion 34a' can be grown or deposited to overfill the void between the lateral gate electrode portions 34b'. The layer of material used to form the center gate electrode portion 34a' can then be polished back to result in the desired center gate electrode portion 34a'. Suitable materials for the center gate electrode portion 34a' include those materials discussed for the center gate electrode portion 34a of the first embodiment of the MOSFET 12 (FIG. 1). In one embodiment of the MOSFET 12', the center gate electrode portion 34a' has a width that is about 50% to about 90% of the total gate length.

As indicated above, the material selected for the center gate electrode portion 34a' is selected to have a particular work function relative to the work function of the material selected for the lateral gate electrode portions 34b'. In this manner, the absolute value of the device threshold in the middle of the channel (as controlled in part by the center gate electrode portion 34a') is less than the absolute value of the device threshold found adjacent the source/body junction and the drain/body junction (as controlled in part by the lateral gate electrode portions 34b').

The method 100 continues in step 132 where the replacement gate layer 120 is removed by an appropriate etch technique. Next, in step 134, the rest of the components of the semiconductor device 10' are formed. Step 134 can include implantation of deep doped regions 136. The deep doped regions 136 can be formed using the techniques described above for the formation of the deep doped regions 74 of the first embodiment of the semiconductor device 10 and will not be described in greater detail.

Additional processing can include, for example, removal of undesired portions of the layer of dielectric material 108, the formation of silicide regions for the source contact 42' and the drain contact 44', the formation of the gate electrode contacts 40', the formation of an oxide cap (not shown), and the like.

The methods 50 and 100 show in a specific order of steps for fabricating the MOSFETs 12 and 12'. However, it is understood that the order may differ from that depicted. For example, the order of two or more steps may be altered relative to the order shown. Also, two or more steps may be carried out concurrently or with partial concurrence. In addition, various steps may be omitted and other steps may be added. For example, masking and doping steps to implant appropriate ion species can be carried out for both NMOS devices and PMOS devices formed on the same wafer. It is understood that all such variations are within the scope of the present invention.

For instance, the method 100 can be modified such that the deep implants 136 are formed after spacer formation in step 106. Silicidation of the source 20' and the drain 22' can also be conducted after spacer formation in step 106. These modifications would be beneficial in situations where the material selected for at least one of the center gate electrode portion 34a', the lateral gate electrode portions 34b' and the gate dielectric 36' is susceptible to being damaged by a source/drain implant activation anneal cycle and/or temperatures involved in the silicidation process. In addition, following these modifications, removal of the replacement gate layer 120 can be avoided in step 132 since processing of the source 20' drain 22' and contacts 42' and 44' have been completed in steps prior to replacement gate layer 98 formation. Of course, the method 50 can similarly be modified, perhaps with the use of a dummy gate and/or disposable spacers.

In another example modification to the method 100, a portion of the layer of dielectric material 108 that is exposed after dummy gate 112 removal in step 122 can be replaced with new layers of dielectric material for the gate dielectric portions 36a' and 36b'. This modification can be advantageous if the layer of dielectric material becomes damaged during dummy gate 112 removal.

In addition, replacement of the a portion of the layer of dielectric material 108 can be used as an opportunity to form the gate dielectric portions 36a' and 36b' from materials different than the material used to form the layer of dielectric material 108. For example, the layer of dielectric material 108 can be made from silicon oxide but replaced in the area formerly covered by the dummy gate 112 with a high-K material used to form the lateral gate dielectric portions 36b'. Then the lateral gate electrode portions 34b' can be formed and the dielectric disposed therebetween can be replaced with material for the center gate dielectric portion 26a'.

The gate dielectric 36' replacement modification to the method 100 to replace a portion of the layer of dielectric material 108 with a different material combined with the modification of early formation of deep implants 136 and/or source 20' and drain 22' silicidation can avoid potential high-K integration issues. Namely, many high-K materials are susceptible to exceeding a thermal budget. Since these modifications result in the completion of most thermal processing before high-K material is deposited, thermal budget issues could be minimized.

As one skilled in the art will appreciate, the method 50 can similarly be modified to replace a portion of the layers of dielectric material 58 and/or 66. These modifications can include the use of a dummy gate and/or disposable spacers. In addition, but depending on other processing considerations (such the need for a screen layer during extension 72 or 114 and/or deep implant 74 or 136 formation, the risk of damage to the layer of semiconductor material 16 or 16', etc.) formation of the layer of dielectric material 108 may be omitted.

Figure 7:
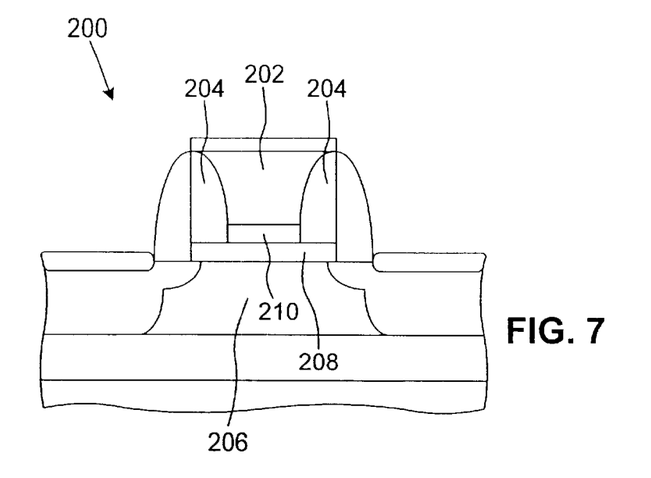
FIG. 7 is a schematic block diagram of a semiconductor device formed in accordance with another example of the present invention.

FIG. 7 illustrates another example embodiment of the present invention. FIG. 7 illustrates a MOSFET 200 having a center gate electrode portion 202 and lateral gate electrode portions 204 formed in accordance with the method 100 (FIG. 5). However, the gate electrode portions 202 and 204 can also be formed in accordance with the method 50 (FIG. 2) or any other appropriate technique for forming a multi-work function gate.

Disposed between the lateral gate electrode portions 204 and a body portion 206 of the MOSFET 200 is a first gate dielectric portion 208 made from a layer of high-K material. Alternatively, the first gate dielectric portion 208 can be made from a standard-K material or a stack of layers used to form a high-K dielectric stack.

Disposed between the center gate electrode portion 202 and the body portion 206 is the first gate dielectric portion 208 and a second gate dielectric portion 210 made from a high-K material (or, alternatively, a standard-K material or high-K dielectric stack). The first gate dielectric portion 208 and the second gate dielectric portion 210 are arranged as a stack such that the second gate dielectric portion 210 is dispose on the first gate dielectric portion 208. Modifications to the methods 100 and/or 200 to form the dielectric portions 208 and 210 in the foregoing arrangement will be apparent to one of ordinary skill in the art and will not be described in great detail.

An alternative arrangement to that shown in FIG. 7 is to separate the lateral gate electrode portions 204 and the body portion 206 with both the first and second gate dielectric portions 208 and 210 and to separate the center gate electrode portion 202 with only one of the first gate dielectric portion 208 or the second gate dielectric portion 210.

Figure 8:
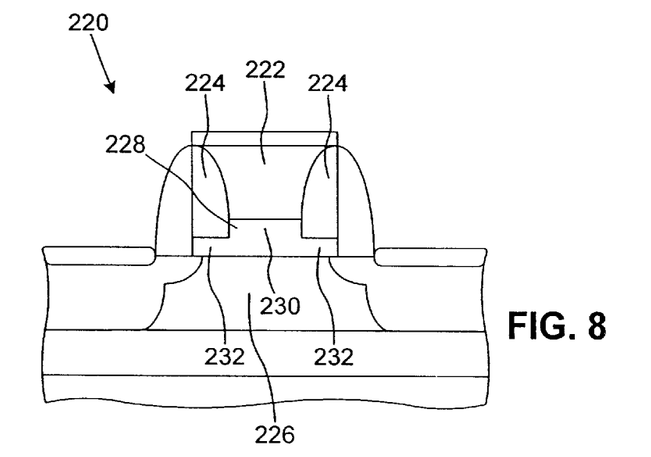
FIG. 8 is a schematic block diagram of a semiconductor device formed in accordance with yet another example of the present invention.

FIG. 8 illustrates yet another example embodiment of the present invention. FIG. 8 illustrates a MOSFET 220 having a center gate electrode portion 222 and lateral gate electrode portions 224 formed in accordance with the method 100 (FIG. 5). However, the gate electrode portions 222 and 224 can also be formed in accordance with the method 50 (FIG. 2) or any other appropriate technique for forming a multi-work function gate.

Disposed between the lateral gate electrode portions 224 and a body portion 226 of the MOSFET 220 is a gate dielectric 228 made from a layer of high-K material. Alternatively, the gate dielectric 228 can be made from a standard-K material or a stack of layers used to form a high-K dielectric stack.

The gate dielectric 228 is also disposed between the center gate electrode portion 222 and the body portion 226. However, a center portion 230 of the gate dielectric 228 separating the center gate electrode portion 222 and the body portion 226 has a different thickness than lateral portions 232 of the gate dielectric 228 separating the lateral gate electrode portions 224 and the body portion 226. In the illustrated example, the center portion 230 is thicker than the lateral portions 232. In an alternative embodiment, the center portion 230 can be thinner than the lateral portions 232. Modifications to the methods 100 and/or 200 to form the gate dielectric 228 in the foregoing arrangement will be apparent to one of ordinary skill in the art and will not be described in great detail. It is noted that these modifications can include forming the gate dielectric 228 by depositing high-K material in one step to form a high-K material layer with a first thickness, carrying out other processing steps to mask portions of the high-K material layer or to form device components thereby creating a self-aligned mask, and then depositing additional high-K material to increase the thickness of a selected portion(s) of the previously deposited high-K material layer. Alternatively, the modifications can include depositing a layer of high-K material and then reducing the thickness of the high-K material layer in a selected portion(s) of the high-K material layer (e.g., by a timed ion-reactive etch technique).

Although particular embodiments of the invention have been described in detail, it is understood that the invention is not limited correspondingly in scope, but includes all changes, modifications and equivalents coming within the spirit and terms of the claims appended hereto.

What is claimed is:

1. A MOSFET comprising:

a source and a drain formed in a layer of semiconductor material; and a gate disposed above the layer of semiconductor material to define a channel interposed between the source and the drain, the gate including:

a center gate electrode portion having a first work function and being spaced from the layer of semiconductor material by a center gate dielectric, the center gate dielectric establishing a first capacitance from the center gate electrode portion to the layer of semiconductor material; and a lateral gate electrode portion adjacent each sidewall of the center gate electrode portion and each lateral gate electrode portion having a second work function different from the first work function, and each lateral gate electrode portion being spaced from the layer of semiconductor material by a lateral gate dielectric portion, each lateral gate dielectric portion establishing a second capacitance from the lateral gate electrode portions to the layer of semiconductor material, the second capacitance different from the first capacitance, and the first work function, the second work function, the first capacitance and the second capacitance cooperate so that an absolute value of a device threshold in a center region of the channel is lower than an absolute value of a device threshold in regions of the channel adjacent each of the source and the drain;

wherein the center gate electrode portion is made from doped polysilicon and the lateral gate electrode portions are made from a metal or metal containing compound.

2. The MOSFET according to claim 1, wherein at least one of the center gate dielectric portion and the lateral gate dielectric portions is made from a high-K material.

3. The MOSFET according to claim 2, wherein the high-K material is composed of one or more materials selected from hafnium oxide, zirconium oxide, cesium oxide, aluminum oxide, titanium oxide, yttrium oxide and mixtures thereof.

4. The MOSFET according to claim 1, wherein the center gate dielectric portion includes a layer of first dielectric material and the lateral gate dielectric portions includes a layer of second dielectric material different from the first dielectric material.

5. The MOSFET according to claim 4, wherein the first dielectric material and the second dielectric material are high-K materials.

6. The MOSFET according to claim 1, wherein the lateral gate dielectric portion includes a first layer of dielectric material and the center gate dielectric portion includes the first layer of dielectric material and a second layer of dielectric material.

7. The MOSFET according to claim 1, wherein the center gate dielectric portion and the lateral gate dielectric portions are formed from the same material, the center gate dielectric has a different thickness than the lateral gate dielectric portions.

8. The MOSFET according to claim 1, wherein the layer of semiconductor material is a semiconductor film disposed on an insulating layer, the insulting layer being disposed on a semiconductor substrate.

9. The MOSFET according to claim 1, wherein the second work function differs from the first work function by about 0.5 eV or less.

* * * * *

UNITED STATES PATENT AND TRADEMARK OFFICE
CERTIFICATE OF CORRECTION

PATENT NO. : 6,586,808 B1
DATED : July 1, 2003
INVENTOR(S) : Xiang et al.

It is certified that error appears in the above-identified patent and that said Letters Patent is hereby corrected as shown below:

Column 1,
Line 40, replace "loff" with -- Ioff --.

Column 6,
Line 66, replace "elected" with -- selected --.

Column 11,
Line 1, replace "appreciate;" with -- appreciate, --.

Column 12,
Line 17, replace "suicide" with -- silicide --.
Line 58, replace "rain" with -- drain --.

Signed and Sealed this

Nineteenth Day of August, 2003

JAMES E. ROGAN
*Director of the United States Patent and Trademark Office*